United States Patent [19]
Manocha

[11] Patent Number: 4,554,048
[45] Date of Patent: Nov. 19, 1985

[54] ANISTROPIC ETCHING

[75] Inventor: Ajit S. Manocha, Allentown, Pa.

[73] Assignee: AT&T Bell Laboratories, Murray Hill, N.J.

[21] Appl. No.: 661,613

[22] Filed: Oct. 17, 1984

[51] Int. Cl.⁴ ............... H01L 21/306; B44C 1/22; C03C 15/00; C23F 1/02
[52] U.S. Cl. ................... 156/643; 156/646; 156/656; 156/657; 156/659.1; 156/662; 156/665; 204/192 E; 427/38; 427/43.1; 430/313
[58] Field of Search ............... 156/643, 646, 653, 656, 156/657, 659.1, 662, 904, 665; 204/164, 192 EC, 192 E; 427/38, 39, 43.1; 430/297, 299, 313, 317, 318; 252/79.1

[56] References Cited
U.S. PATENT DOCUMENTS
4,436,584 3/1984 Bernacki et al. .................. 156/643

OTHER PUBLICATIONS

"High Temperature Flow Resistance . . . ", *Journal of Electrochemical Society,: Solid–State Science and Technology*, Dec., 1981, pp. 2645–2647, vol. 128, No. 12, Hiraoka et al.

"Plasma Resist Stabilization Technique", (PRIST), IEEE, IEDM Conference Abstracts, 1980, p. 574, W. Ma.

*Primary Examiner*—William A. Powell
*Attorney, Agent, or Firm*—Peter V. D. Wilde

[57] ABSTRACT

The specification describes a process for treating patterned VLSI lithographic masks to retain their shape during processing of VLSI wafers. The process avoids the common postbake treatment which tends to cause sagging of the sidewalls of the mask. Retention of vertical sidewalls on the mask edges has been found important for producing vertical sidewalls in layers that are being anisotropically etched.

5 Claims, 5 Drawing Figures

FIG. 1A
APPLY PR
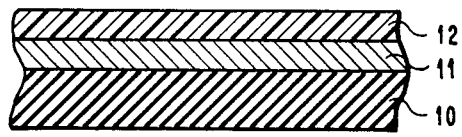
FIG. 1B
PATTERN PR
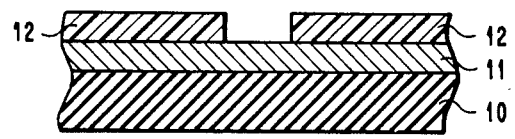
FIG. 1
(PRYOR ART)
FIG. 1C
POSTBAKE PR
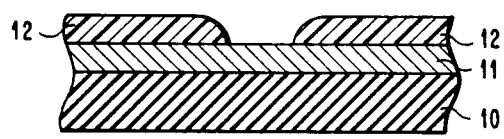
FIG. 1D
ETCH ANISOTROPICALLY
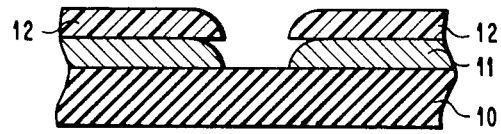
FIG. 2
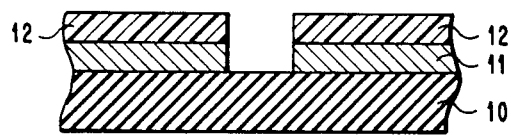

ANISTROPIC ETCHING

BACKGROUND OF THE INVENTION

The use of newly discovered anisotropic etching processes has led to major advances in the manufacture of microelectronic devices. The ability to form openings in dielectric and metal layers with very precise dimensions, and, where needed, with optimally small dimensions enables device packing densities unobtainable without these processes. Moreover, anisotropic techniques have increased processing reliability. This leads to higher device yields and attendant lower device costs. Nearly all leading edge VLSI silicon devices will be made using these techniques.

The physical mechanism by which straight sidewalls result from reactive ion etching (RIE) processes has been debated for some time. A widely accepted explanation is the so-called recombinant theory advanced by Mogab and co-workers at AT&T-Bell Laboratories. Their explanation involves a choice of chemical species for the gaseous plasma environment that includes a recombinant species. The recombinant species chemically reacts with the active etchant species after the first energetic collision. Energetic collisions are controlled by the electric field, and they are consequently directional. They occur primarily on sites that are normal to the beam direction. Secondary collisions, that would occur on the sidewalls and produce sidewall etching, are effectively prevented by the presence of the recombinant. Another theory is described in U.S. Pat. No. 4,436,584, issued Mar. 13, 1984 to Bernacki et al, and attributes the absence of sidewall etching in anisotropic techniques to the formation of a polymer film on the sidewalls. Due to some property of the beam associated with its directionality, the polymer does not form on surfaces normal to the beam.

I have discovered experimentally that the etching behavior of so-called anisotropic systems is strongly influenced by the angle of the sidewall of the layer used as a mask. My findings are similar to those reported in the aforementioned patent of Bernacki et al. In one of my experiments an asymmetric photoresist mask was used. One side of the mask had an essentially vertical sidewall, the other side had a sloped sidewall. The layer being etched, which in this experiment was a silicon dioxide layer, developed a vertical sidewall under the mask edge that was essentially vertical, but the oxide beneath the sloped mask edge showed a decided undercut. This provides clear evidence that the degree of anisotropy depends on the slope of the wall of the masking layer and not primarily on any of the variety of variables in the etch process itself. It then became apparent that steep sidewalls on the photoresist pattern would be desirable for anisotropic etching processes. However, the sidewalls on typical photoresist patterns tend to slope.

STATEMENT OF THE INVENTION

In addition to my discovery of the need for steep photoresist sidewalls in anisotropic etching processes, I have discovered an effective means for obtaining these desirable mask configurations. That effective means is to eliminate the photoresist postbake that is conventionally used in photoresist technology. That postbake, I have found, tends to make the photoresist sidewalls sag, and tends to cause tapering of the sidewalls. In addition, I have found that photoresist patterns that are not postbaked will sag upon exposure to the RIE beam, and the desired steep sidewall will be lost. I have made the additional and significant technological discovery that the sagging of the photoresist sidewall that is experienced upon exposure to the ion beam can be avoided if the unbaked, or essentially unbaked, photoresist is first exposed to a low energgby ion beam. The voltage of the beam can then be turned to or ramped up to operating level while preserving the desired steep sidewall geometry.

BRIEF DESCRIPTION OF THE DRAWINGS

FIGS. 1A-1D are schematic representations showing the typical prior art sequence for anisotropic etching processes;

FIG. 2 is a schematic representation showing the results of the process sequence of this invention in which the step represented by FIG. 1D is omitted.

DETAILED DESCRIPTION

With reference to FIGS. 1A-1D, the normal prior art sequence for anisotropically etching during the manufacture of integrated circuits involves the application of a resist layer 12 to a layer 11 to be etched. In some cases, for example in the formation of so-called trench capacitors, or trench isolation regions, the object is to etch anisotropically directly into the substrate semiconductor. This invention is directed to either process, and to processes for anisotropically etching any material. In general, the materials of interest are dielectric materials, typically silicon dioxide or silicon nitride, or conductor materials such as polysilicon, metal silicides, aluminum, etc. and composite layers of any of these materials.

After application of the resist layer, which is typically a photoresist, but may be an electron beam or other resist layer used in lithographic processes, the resists layer is patterned as represented by FIG. 1B. After patterning, the resist is baked to fully cure the resist and harden it. The baked resist layer is shown in FIG. 1C and shows the rounding of the corners of the pattern, and sloping of the vertical sidewalls, that is characteristic of the postbake process. This postbake process is used universally in lithography technology and inevitably produces some sagging of the sidewalls of the photoresist. The structure of FIG. 1C is then exposed to a reactive ion etching process that is designed for anisotropic etching of the region of layer 11 that is exposed in the photoresist window. Anisotropic etching processes, discussed earlier, are well known and widely used in VLSI technology. Due to the phenomenon that I discovered, namely that vertical sidewall etching requires vertical sidewalls in the overlying photoresist, and sloping sidewalls in the photoresist pattern produce sloping sidewalls in the etched layer, the result of anisotropically etching layer 11 produces the result shown in FIG. 1D. That result is an undercut, or sloped sidewall in layer 11. Although the result will reflect some degree of anisotropic etching, i.e. more than with deliberate isotropic etching, it will be inferior to the result obtained using my invention.

My invention involves the elimination of the postbake step, and the anisotropic etching of layer 11, to produce the result shown schematically in FIG. 2. I have found that the anisotropic etch step can be carried out successfully without using the postbake operation, i.e. without the adverse consequences that may be expected from elimination of a widely used step. However, in some cases exposure of unbaked photoresist to the high energy plasma will cause the sidewalls of the photoresist pattern to sag in much the same way as they sag during the postbake. I have discovered that this sagging during the initial phase of the etching operation can be avoided by slowly increasing or ramping the voltage of the RIE apparatus to reach the operating level. This appears to cause an in situ hardening of the photoresist without loss of the steep sidewall profile that is necessary for obtaining vertical sidewalls in the etched layer. The voltage is then increased to the operating level and the etch step completed as usual.

The effectiveness of the invention was demonstrated using a patterned photoresist, Hunt 204, that was placed in the plasma etching apparatus after development but without the conventional postbake operation. The etching apparatus was an AMI-Hex Etcher. The etching operation in this demonstration was a tantalum silicide etch process used in the manufacture of random access memory devices. However, the specific etching operation, and the details of that operation, are not part of the invention. The silicide etch is effected at a relatively low plasma power level, and the invention is most suitably applied to such low power level processing. However, it would not be unexpected that higher power level processing is susceptible to the teachings described here. The plasma reactor was filled with $CFCl_3$ (Freon $-11$) at $\sim 12\mu$ and the power level adjusted to give 90 volt DC bias. This level is insufficient to effect useful etching but is adequate to achieve the photoresist pretreatment of the invention. After pretreatment for one half to ten minutes, the power level is adjusted to within the normal etching range, approximately 300 v, and the etch step run to completion. The resist profile retains nearly the precise configuration it exhibited after development. That profile is characterized by vertical walls and the etched layer is characterized also by vertical walls.

Although it would be expected that the expedients described here would find application primarily in anisotropic processes, they may find more general uses, for example, in any lithography operation where the shape of the resist pattern is to be held to close tolerances.

The mechanism of the resist pretreatment operation of this invention is not completely understood but is probably attributable to the curing effect of ultraviolet light that is produced by the glow of the plasma. Other workers have proposed using ultraviolet radiation to cure patterned resists. See, for example, Hiraoka et al, Journal of the Electrochemical Society, Solid State Science and Technology, December 1981, pp. 2645-2647. However, the in situ process described here has obvious and important advantages over that of Hiraoka et al. Other effects, such as the known so-called "prist" treatment (see W, H-L Ma, "Plasma Resist Stabilization Technique (PRIST), IEEE, IEDM Conference Abstracts, 1980, p. 574.) may be operative as well.

The foregoing describes a process sequence in which the conventional postbake operation has been omitted at the usual stage in the photolithography process. The term "postbake" is an accepted term of art that means baking the resist at a temperature of the order of 200° C. for a period sufficient to harden the photoresist. There have been suggestions in the art of the use of a so-called "soft-bake" which is a heating operation substantially below the normal postbake temperature. The use of a soft-bake will not, according to my results, achieve the vertical wall structure described in conjunction with the in situ process step of my invention.

Conditions for the in situ hardening step may vary over a wide range. I recommend a treatment for 0.5–10 minutes at an operating voltage substantially below the effective etch voltage, i.e. less than 50% of the operating voltage. These conditions can be complicated if ramping of the voltage is used. However, use of the invention should be evident, and can be easily defined in terms of use of voltages below the effective etching voltage. No other apparent purpose would be served by treating a wafer at a low voltage, in an apparatus set up for dry etching.

Various additional modifications and extensions of this invention will become apparent to those skilled in the art. All such variations and deviations which basically rely on the teachings through which this invention has advanced the art properly considered to be within the spirit and scope of this invention.

What is claimed is:

1. A lithographic process comprising,
applying a resist material to a substrate,
patterning the resist by a lithographic patterning step,
placing the substrate in a dry etching apparatus,
exposing the substrate to a reactive gas plasma at an electric power level below the level at which effective etching of the substrate occurs, and continuing that exposure for a period sufficient to harden the patterened resist, and
exposing the substrate, without interruption, to the same plasma adjusted at a power level sufficient to effect etching of the substrate.

2. The process of claim 1 in which the substrate is silicon coated with multiple layers and the layer being etched is a metal silicide.

3. The process of claim 1 in which the reactive gas plasma is chosen to produce anisotropic etching of the substrate.

4. The process of claim 1 in which the substrate is placed in the etching apparatus after patterning of the resist and without any intervening baking step.

5. The process of claim 4 in which the resist is a photoresist.

* * * * *